United States Patent [19]
Bollesen

[11] Patent Number: 5,963,427
[45] Date of Patent: Oct. 5, 1999

[54] MULTI-CHIP MODULE WITH FLEXIBLE CIRCUIT BOARD

[75] Inventor: Vernon P. Bollesen, Milpitas, Calif.

[73] Assignee: Sun Microsystems, Inc., Palo Alto, Calif.

[21] Appl. No.: 08/988,788

[22] Filed: Dec. 11, 1997

[51] Int. Cl.⁶ ..................................................... H05K 7/20
[52] U.S. Cl. ........................ 361/704; 361/737; 361/749; 361/756; 257/719; 174/35 R
[58] Field of Search ............................ 361/683, 702–704, 361/707–712, 719–720, 737, 749, 756, 790, 778; 257/669, 676, 719, 722, 723; 174/254, 35 R, 261; 29/831, 837; 439/67

[56] References Cited

U.S. PATENT DOCUMENTS

| | | | |
|---|---|---|---|
| 3,582,865 | 6/1971 | Franck | 361/714 |
| 3,766,439 | 10/1973 | Isaacson | 361/714 |
| 5,359,493 | 10/1994 | Chiu | 361/719 |
| 5,760,465 | 7/1998 | Alcoe et al. | 257/669 |

FOREIGN PATENT DOCUMENTS 410150065   6/1998   Japan ............................. H01L 21/60

*Primary Examiner*—Leo P. Picard
*Assistant Examiner*—Michael Datskovsky
*Attorney, Agent, or Firm*—Townsend and Townsend and Crew LLP

[57] ABSTRACT

An improved memory module for mounting chips. The memory module has a circuit board which is at least partially flexible between a first part and a second part. The first part is mounted horizontally over a second circuit board, such as a mother board. The second part is then bent upward, with the memory chip(s) being mounted on the second part of the circuit board. A heat sink is mounted so that it contacts both the first, horizontal part of the circuit board, and the memory chip(s).

10 Claims, 2 Drawing Sheets

MULTI-CHIP MODULE WITH FLEXIBLE CIRCUIT BOARD

BACKGROUND OF THE INVENTION

The present invention relates to chip modules, and in particular to modules for memory chips.

A number of mounting methods are used for mounting chips on circuit boards. In a computer system, typically a microprocessor is mounted on a mother board, with SRAM memory chips forming a cache memory also mounted on the mother board. DRAMs are used for main memory, and are often mounted on separate circuit boards which attach to the mother board. Typically, a SIMM (Single In-line Memory Module) or DIMM (Dual In-line Memory Module) module is used, which plugs into a vertical connector with DRAM chips on one (SIMM) or both sides (DIMM).

SRAMs are typically accessed in parallel and generate more heat than DRAMs. Accordingly, heat sinks may need to be attached to SRAM chips.

The combination of increased memory density in the chips, and faster clock speeds, results in higher power requirements and higher heat sinking requirements for memory chips, in particular SRAMs. In addition, the need for high speeds requires that the chips be mounted closer to the microprocessor to reduce the distance signals have to travel. Additionally, capacitance and inductance caused by travel from lines on the mother board through connectors to the memory chips undesirably loads down the connection lines.

SUMMARY OF THE INVENTION

The present invention provides an improved memory module for mounting chips. The memory module has a circuit board which is at least partially flexible between a first part and a second part. The first part is mounted horizontally over a second circuit board, such as a mother board. The second part is then bent upward, with the memory chip(s) being mounted on the second part of the circuit board. A heat sink is mounted so that it contacts both the first, horizontal part of the circuit board, and the memory chip.

In one embodiment, the circuit board is U-shaped, with chips mounted on both sides of the two vertical portions of the U. The heat sink can be pushed down over the U for mounting, so that it has vertical portions in contact with each of the chips, and a horizontal portion in contact with the bottom of the inside of the U. The heat sink thus adds stability to the structure, since the flexible circuit is not itself stiff. The fins of the heat sink are positioned on the inside of the U, thereby saving space. The structure allows an inexpensive, extruded heat sink to be used.

In one embodiment, the bottom part of the U is attached to the mother board by a ball grid array. Thus, rather than using in-line connectors as for a SIMM, a ball grid array which would normally be used to mount the chip to the circuit board can be used to mount the module. Such a ball grid array will reduce the amount of inductance and load due to the connections, and also enables a shorter distance from the mother board to the chips.

For a further understanding of the nature and advantages of the invention, reference should be made to the following description taken in conjunction with the accompanying drawings.

DETAILED DESCRIPTION OF THE INVENTION

Figure 1:
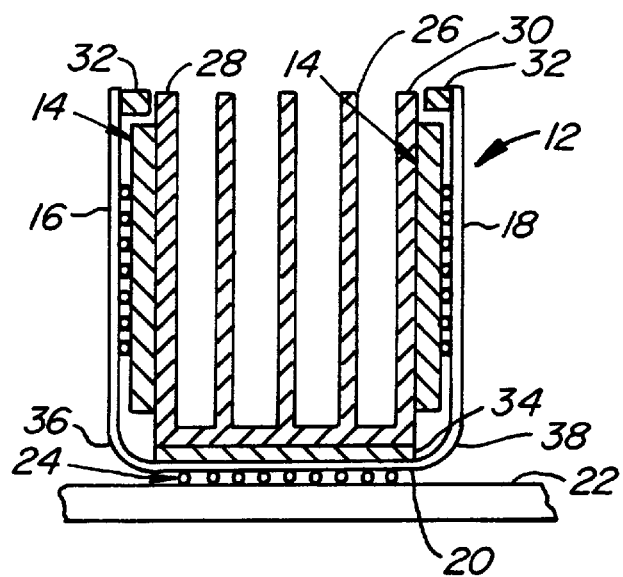
FIG. 1 is a side view of one embodiment of the invention with two chips.

FIG. 1 shows an embodiment of the invention having a U-shaped circuit board 12 with memory chips 14 mounted on second and third parts of the circuit board, 16 and 18, respectively. A first, bottom part 20 of the circuit board is mounted to a main circuit board or mother board 22 by a ball grid array 24. Mounted inside the U is a heat sink 26 having a number of vertical fins, and including two portions 28 and 30 in contact with chips 14. Also shown are decoupling capacitors 32.

Circuit board 12 may be a flexible circuit board which is not stiff, and thus can be bent into the shape shown. A stiffener 34 can be glued to the first part 20 of the circuit board to give it stiffness so it can be mounted on the mother board 22.

Alternately, circuit board 12 might be a stiff board, which is only flexible in the joint 36 between parts 20 and 16, and the joint 38 between parts 20 and 18. Alternately, a completely stiff, U-shaped board could be manufactured. In such a case, stiffener 34 would be unnecessary, and a heat sink could be attached directly to the circuit board.

In one embodiment, the heat sink is glued with a thermally conductive epoxy to both the circuit board or stiffener and to the memory chips.

In one embodiment of the manufacturing method, the chips are first mounted onto the circuit board and it is tested. Any defective chips can be replaced. Once the chips have passed any testing, stiffener 34 for can glued to the circuit board, if it is a completely flexible circuit board. Next, the heat sink can be glued to the stiffener, with the circuit board being bent and the chips being glued to the heat sink. At this point, a stiff module is provided which can be mounted with ball grid array 24 to mother board 22.

Figure 2:
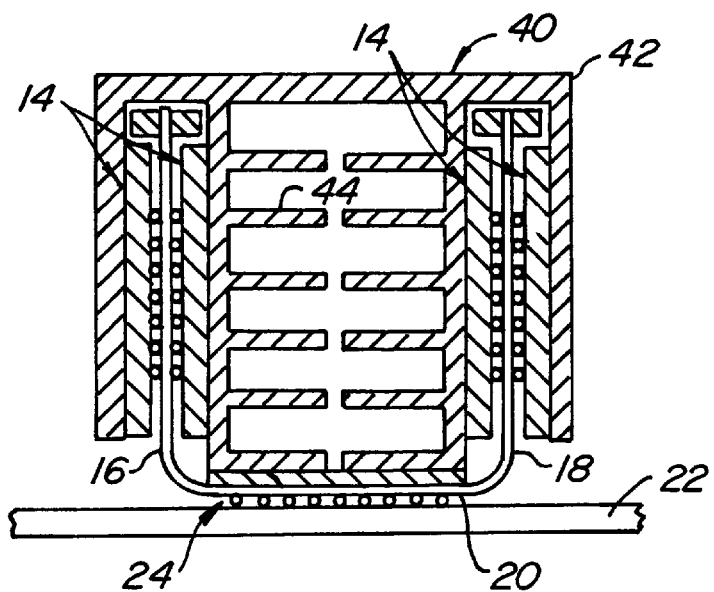
FIG. 2 is a diagram of an alternate embodiment with four chips.

FIG. 2 illustrates an alternate embodiment in which four chips 14 are mounted on either side of parts 16 and 18 of the circuit board. A different configuration of a heat sink 40 is used, having a top portion 42 extend across the U, and four downward projecting portions in contact with each of chips 14. In addition, internal horizontal fins 44 are provided for the heat sink. The fins do not extend all the way across, with a gap in the middle, in order to allow manufacture by extrusion.

A number of alternate embodiments are possible. The fins in FIG. 2 could extend all the way across, or could be vertical as in FIG. 1. In addition, the fins of FIG. 1 could be horizontal instead of vertical. The circuit board could be flexible, partially flexible, or entirely stiff. In an alternate embodiment, instead of a ball grid array, other connectors could be used. For example, Z-axis conductive epoxy (an epoxy with conductive particles) could be used. Alternately, two parallel in line connectors could be used instead of ball grid array 24, or connectors around the perimeter rather than in an array could be used. The ball grid array is particularly useful for high data applications, in particular 144 data lines may be required for a typical SRAM module.

Figure 3:
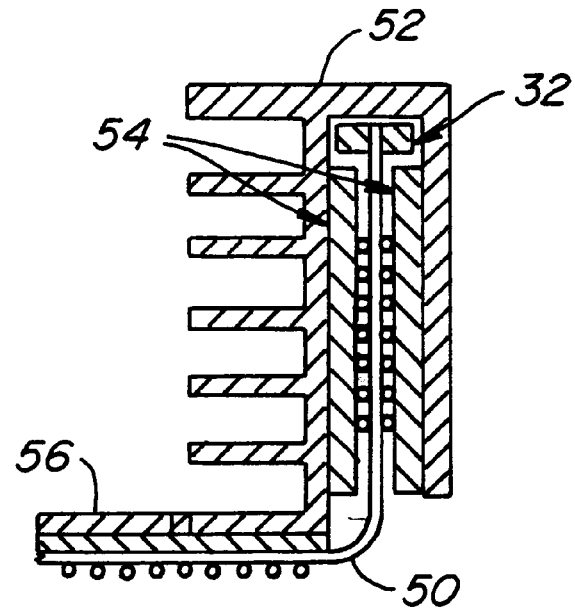
FIG. 3 is a diagram of an alternate embodiment of an L-shaped board with heat sink fins on the inside.

FIG. 3 illustrates one alternate embodiment in which a circuit board 50 is L-shaped. Heat sink 52 wraps around two semiconductor chips 54, and has a portion 56 which provides the mounting stability over the bottom of the circuit board 50.

Figure 4:
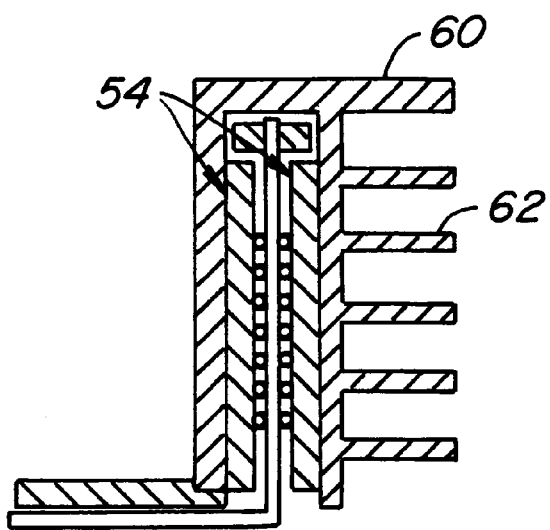
FIG. 4 is a diagram of an alternate embodiment of an L-shaped board with the heat sink fins on the outside.

FIG. 4 shows yet another embodiment in which a heat sink 60 has fins 62 on the outside, rather than on the inside as in FIG. 3.

The semiconductor chips could be SRAMs, or alternately they could be DRAMs, or other memory chips. Alternately, the module of the present invention could be used for other types of logic chips which generate significant heat, such as multiple microprocessors.

In another embodiment, rather than having the four chips of FIG. 2, eight chips or a larger number of chips could be mounted by providing multiple chips in a line on each side of the circuit board in a direction coming into or going out of the page.

In one embodiment of the structure shown in FIG. 1, the entire horizontal width of the module may be less 0.82 inches, and the height approximately 0.76 inches. The embodiment of FIG. 2 may have a horizontal width of only 0.91 inches, with a height of 0.76 inches. Obviously, other dimensions could be used to practice the invention.

In constructing the heat sink, such as heat sink 40 in FIG. 2, is important to have the vertical parts match the surface of the chips 14 so that there are no gaps, in order to provide maximum heat conduction. Conductive epoxy can be used to fill in the gaps, but it is preferable to minimize the amount of epoxy required. Because the outside chips have a farther distance to go on the heat sink to reach fins 44, it is more important to have tight tolerances on the outside edges of the heat sink.

As will be understood by those skilled in the art, the present invention may be embodied in other specific forms without departing from the spirit or essential characteristics thereof. Accordingly, the foregoing description is intended to be illustrative, but not limiting, of the scope of the invention which is set forth in the following claims.

What is claimed is:

1. A chip module for attaching to a first circuit board, comprising: a second U-shaped circuit board having a first part mounted horizontal to said first circuit board, and having second and third parts at an angle to said first circuit board, said second circuit board being flexible at least between said first and second parts and between said first and third parts; at least one semiconductor chip mounted on each of said second and third parts of said second circuit board; a ball grid array of electrical connectors between said first part of said second circuit board and said first circuit board; and a heat sink mounted on said first part of said second circuit board, said heat sink including a plurality of fins, at least first and second fins being in contact with respective semiconductor chip, and a plurality of additional fins extending over said first part of said second circuit board in between said first and second parts, said heat sink further including a flat portion in contact with a substantial area of said first part of said second circuit board.

2. The chip module of claim 1 wherein said plurality of electrical connectors are formed of a Z-axis conductive epoxy.

3. The chip module of claim 1 further comprising semiconductor chips mounted on both sides of each of said second and third parts of said second circuit board, said heat sink having portions in contact with each of said chips.

4. The chip module of claim 3 wherein said heat sink comprises:

a first horizontal part over a top of said U-shaped second circuit board;

four vertical parts extending down from said first horizonal part, each of said four vertical parts being in contact with one of said chips;

a plurality of fins extending inward from a pair of said vertical parts inside said U-shaped second circuit board; and at least one bottom part in contact with said first part of said second circuit board.

5. The chip module of claim 1 further comprising a stiffener between said heat sink and said first part of said second circuit board.

6. The chip module of claim 1 wherein said at least one chip is a memory chip.

7. A computer system comprising:

a mother board;

a microprocessor mounted on said mother board;

a plurality of memory chips; and a chip module for attaching said memory chips to said mother board, said chip module including a second circuit board having a first part mounted horizontal to said mother board, and having second and third parts at an angle to said mother board, said second circuit board being flexible at least between said first and second parts and between said first and third parts;

said plurality of memory chips being mounted on said second and third parts of said second circuit board;

a plurality of electrical connectors between said first part of said second circuit board and said mother board; and a heat sink mounted on said first part of said second circuit board, said heat sink including a plurality of fins, at least first and second fins being in contact with at least first and second ones of said semiconductor chips, respectively, and a plurality of additional fins extending over said first part of said second circuit board in between said first and second parts, said heat sink further including a flat portion in contact with a substantial area of said first part of said second circuit board.

8. A method for mounting chips on a memory module, comprising the steps of:

mounting at least one semiconductor chip on each of a second part and a third part of a circuit board, said circuit board being at least partially flexible;

bending said circuit board between said second part and a first part, and between said third part and said first part; and gluing a heat sink to said first part of said circuit board and said chip, said heat sink including a plurality of fins, at least first and second fins being in contact with at least first and second ones of said semiconductor chips, respectively, and a plurality of additional fins extending over said first part of said second circuit board in between said first and second parts.

9. The method of claim 8 further comprising the steps of:

attaching a stiffener between said heat sink and said first part of said circuit board.

10. The method of claim 8 further comprising the step of attaching said circuit board to a mother board with a ball grid array on said first part of said circuit board.

* * * * *